United States Patent
Roush et al.

Patent Number: 5,374,589
Date of Patent: Dec. 20, 1994

[54] PROCESS OF MAKING A BISTABLE PHOTOCONDUCTIVE COMPONENT

[75] Inventors: Randy A. Roush, King George, Va.; Michael S. Mazzola, Miss.; David C. Stoudt, King George, Va.

[73] Assignee: The United States of America as represented by the Secretary of the Navy, Washington, D.C.

[21] Appl. No.: 223,350

[22] Filed: Apr. 5, 1994

[51] Int. Cl.$^5$ .......................................... H01L 21/223
[52] U.S. Cl. ........................... 437/166; 437/142; 437/248
[58] Field of Search ............... 437/142, 165, 166, 248, 437/926, 949, 987; 148/DIG. 21, DIG 22, DIG. 23

[56] References Cited

U.S. PATENT DOCUMENTS

| | | | |
|---|---|---|---|
| 3,530,014 | 9/1970 | Antell | 437/142 |
| 3,984,267 | 10/1976 | Craford et al. | 437/987 |
| 4,282,043 | 8/1981 | Chang | 437/949 |
| 4,545,824 | 10/1985 | Salvi et al. | 437/987 |
| 4,594,173 | 6/1986 | Hobgood et al. | 117/17 |
| 4,698,104 | 10/1987 | Barker et al. | 437/141 |
| 4,717,588 | 1/1988 | Wilson et al. | 437/142 |
| 5,137,847 | 8/1992 | Shimakura et al. | 437/248 |
| 5,228,927 | 7/1993 | Kitagawara et al. | 437/248 |

Primary Examiner—Brian E. Hearn
Assistant Examiner—Chandra Chaudhari
Attorney, Agent, or Firm—Jacob Shuster

[57] ABSTRACT

Semi-insulating gallium arsenide wafers manufactured with varying silicon density shallow donors are copper compensated by heating to temperature of at least 550° C. to thermally diffuse the copper into the wafers and thereby provide deep copper acceptors in the wafer. Higher annealing temperatures are employed for higher concentrations of silicon in the wafers and the thermal diffusion is accomplished in the presence of copper, and in some instances, in the presence of varying quantities of arsenic. The copper compensated, silicon doped, gallium arsenide wafers obtained have the electrical property characteristic capability of being used as photoconductive switching components. In one aspect of the invention the silicon doped gallium arsenide wafer is sealed in a quartz ampoule in the presence of solid copper and solid arsenic and heated to the annealing temperature. In another aspect of the invention, the copper and arsenic are flowed as vapors over the silicon doped gallium arsenide wafer disposed in a reaction tube within a diffusion furnace, while the wafer is heated to the annealing temperature.

20 Claims, 4 Drawing Sheets

PROCESS OF MAKING A BISTABLE PHOTOCONDUCTIVE COMPONENT

The invention described herein was made by employees of the United States Government and may be manufactured and used by or for the Government for governmental purposes without the payment of any royalties thereon or therefor.

FIELD OF THE INVENTION

This invention relates generally to semiconductors and relates specifically to a fabrication process for making copper compensated, silicon doped, gallium arsenide for use as a base material in constructing bistable, photoconductive switches.

BACKGROUND OF THE INVENTION

Semi-insulating gallium arsenide has been explored as a candidate for use in photoconductive switching. Typically, gallium arsenide is made semi-insulating by a manufacturer using compensation mechanism which causes free electron charges in the material to become trapped or immobile. Since boat-grown gallium arsenide is inherently produced with silicon impurities (a shallow donor) throughout the crystal, deep acceptors such as carbon and chrome are frequently deliberately added to the melt in order to cause the donor electrons to become trapped at the deep acceptor levels. Copper also forms deep acceptors in gallium arsenide, however, copper compensated gallium arsenide cannot be obtained through industry (without enormous expense) because copper is considered to be a contaminant in processing systems. This is because the gallium arsenide processing industry focuses almost entirely on fast optoelectronic devices and semiconductor laser technology, and copper in gallium arsenide destroys the effects that are desired in both of these applications.

One application for copper compensated, silicon doped, gallium arsenide now in the development stages, is high power photoconductive switching. Therefore, there is a need to establish processing standards for copper in gallium arsenide with respect to photoconductive switching applications to accelerate maturity and transition to industry of this switching technology.

Previous experiments have been conducted to show that low resistivity, silicon-doped, gallium arsenide can be made highly resistive by doping with known amounts of copper. Experiments allowing this unique material (GaAs:Si:Cu) to be used as a bistable photoconductive switch, known as BOSS (Bulk Optically controlled Semiconductor Switch), are disclosed in U.S. Pat. No. 4,825,061 to Schoenbach et al. The fabrication of BOSS devices, as disclosed by Schoenbach et al has involved the introduction of copper into silicon-doped gallium arsenide by thermal diffusion. Copper forms two dominant deep acceptor levels in gallium arsenide known as $Cu_A$ and $Cu_B$. These acceptor levels trap the free electrons in the crystal at the deep copper centers. Thermal diffusion processes for introduction of copper into silicon-doped gallium arsenide has been noted by J. Blane, R. H. Bube, and H. E. MacDonald, *J. Appl. Phys*, 32(9), 1961; Kullendorf et al, "Copper-Related Deep Level Defects in III-IV Semiconductors", *J. Appl. Phys.* vol. 54, pp 3203–3312, 1983; and Hasegawa *J. Appl. Phys.* 45, 1944 (1974).

It has also been shown that this material can be used as a photoconductive switch which means that the electrons trapped at the deep copper levels can be excited into conduction by a laser pulse of wavelength 1.06 $\mu$um, and this temporary photocurrent can be extinguished by stimulating the GaAs:Si:Cu switch with another laser pulse intensity of 1.7 $\mu$um. Upon excitation by the first laser pulse (a few nanoseconds in duration) the switch current rises to a peak, and then decays with the laser pulse intensity until the current through the switch is dominated by electron current instead of the electron-hole plasma created during the laser pulse (FIG. 6). At that time, the magnitude of the current is dependent on the density of electrons that were elevated from the copper center, and the lifetime of these electrons is on the order of During the time after the first laser pulse excites the photocurrent, the switch is said to be in the "on-state", and therefore the conductivity during this phase of the switching cycle can be called the on-state conductivity. This on-state conductivity is an important parameter in the design of the switch because it determines the efficiency of the switch in delivering power to a load. The saturation of the on-state conductivity (called $\sigma_{ss}[\Omega cm]^{-1}$) occurs when the laser intensity is increased such that all of the electrons trapped at the $Cu_B$ level are excited into the conduction band. Past results have shown $\sigma_{ss}$ to be poor, and methods to control this important switching parameter are needed and have not been addressed previously.

SUMMARY OF THE INVENTION

It is therefore an object of the present invention to provide a process for making improved on-state conductivity GaAs:Si:Cu crystals.

Another object of the present invention is a process of introducing additional copper in the form of $Cu_B$ into a silicon doped gallium arsenide crystal.

A further object of the present invention is a process of making copper compensated gallium arsenide for use as a photoconductive switching component.

Another object of the present invention is a process for copper compensation of silicon doped gallium arsenide crystals under controlled parameters of arsenic pressure, temperature, time, and silicon density.

Still another object of the present invention is a process for copper compensation of a silicon doped gallium arsenide crystal that produces a switching component having improved switch saturation on-state conductivity that can deliver power to a load with a minimum power dissipation in the switch.

A still further object of the present invention is a process for predicting the copper concentration and compensation temperatures for a gallium arsenide crystal that has been previously doped with a specific silicon shallow donor density.

An additional object of the present invention is a process of doping a gallium arsenide crystal with pure copper in the presence of arsenic.

Another additional object of the present invention is a process for copper compensation of silicon doped gallium arsenide crystals under specific and predictable arsenic pressure conditions.

A still further object of the present invention is a thermal diffusion process of doping a gallium arsenide crystal with copper within a quartz ampoule and in the presence of solid copper and solid arsenic.

Another object of the present invention is a process of thermal diffusion of a silicon doped gallium arsenide crystal in a reaction tube in the presence of controlled arsenic and copper vapor pressures.

According to the present invention the foregoing and additional objects are attained by providing a gallium arsenide crystal doped with silicon and heating the GaAs:Si in the presence of copper and arsenic, to at least 550° C. to anneal the copper and cause the vapor phased copper to be diffused into the GaAs:Si crystal.

By varying the initial silicon concentration, and matching this silicon concentration with copper concentrations to achieve compensation, the resulting higher copper concentration corresponds to higher $Cu_B$ concentration and thus, an enhanced $\sigma_{ss}$.

This is because higher $Cu_B$ concentrations correspond to more electrons trapped at $Cu_B$, which causes the saturation on-state conductivity to be enhanced. The same result is achieved by a process involving preferential formation of $Cu_B$, or where the majority of the diffused copper forms $Cu_B$ instead of $Cu_A$.

Gallium arsenide is obtained from the manufacturer with a known silicon concentration and this determines the amount of copper required to observe electrical compensation. The band diagram for silicon and copper levels are schematically shown in FIG. 1. At room temperature, the donor electrons associated with silicon are thermally ionized into the conduction band. Therefore, the material purchased from the manufacturer (GaAs:Si) is low resistively [<0.1 (Ω cm)], and the copper is thermally diffused into the GaAs:Si to establish the known deep copper acceptors ($Cu_A$ and $Cu_B$) which trap the free electrodes at energy levels that are not thermally ionized to any large degree at room temperature. The material thus becomes highly resistive $[>10^5 (\Omega \text{ cm})]^{-1}$.

The fabrication process, according to one aspect of the present invention, involves loading the GaAs:Si into quartz ampoules along with solid sources of arsenic and copper of known masses. The copper source may be in the form of a copper lining on the quartz ampoule, a film of copper plate on the surface of the GaAs:Si sample, or a solid source of copper placed on the sample. Each ampoule is loaded with 10 mg arsenic and approximately 3 mg copper. The quartz ampoule is evacuated to low pressure ($<5 \times 10^{-6}$ Torr) and sealed. The quartz ampoule is then placed in an oven furnace where the temperature around and across the ampoule is controlled to ±1° C. while heated to annealing temperature.

In another aspect of the present invention, a gallium arsenide, silicon doped, crystal is placed in a reaction tube loaded in a diffusion furnace and copper and arsenic partial pressures provided around the crystal and controlled by flowing copper and arsenic vapors into the tube.

Electrical compensation is achieved for four different silicon concentrations: $1 \times 10^{16}$ cm$^{-3}$; $2 \times 10^{16}$ cm$^{-3}$; $6 \times 10^{16}$ cm$^{-3}$; and $7 \times 10^{17}$ cm$^{-3}$. The temperature at which compensation is achieved can be predicted by plotting the temperature at which the lowest dark conductivity is achieved (FIG. 7) against the initial silicon concentration.

DETAILED DESCRIPTION

Figure 1:
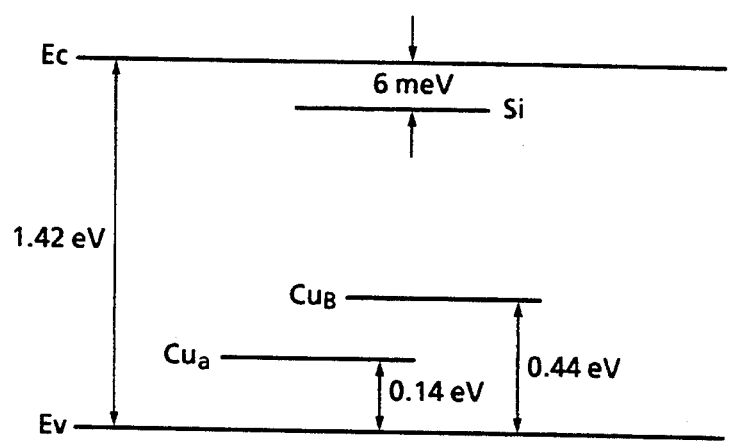
FIG. 1 is a schematic, graphical, band diagram of copper related energy levels in gallium arsenide and the silicon donor level.

Referring now to the drawings, and more particularly to FIG. 1, the band gap between the conduction (Ec) and valence bands (Ev) in gallium arsenide is 1.42 eV. The silicon donor level in this band gap is at 6 meV. Copper forms two dominant deep acceptor levels in gallium arsenide known as $Cu_A$, at 0.14 eV, and $Cu_B$, at 0.44 eV. These acceptor levels trap the free electrons in the GaAs crystal at the deep copper center, as is known in the prior art.

Since it is known that a switch formed by GaAs:Si:CU crystal is excited by a laser pulse that has an energy which causes an electron to transition from the $Cu_B$ level into the conduction band, then the on-state conductivity of GaAs:Si:CU can be improved by introducing more copper, in the form of $Cu_B$, into the crystal. Therefore, higher $Cu_B$ concentrations correspond to more electrons trapped at $Cu_B$, which causes the saturation on-state conductivity to be enhanced.

Two basic processing methods are employed by the present invention to enhance the on-state conductivity ($\sigma_{ss}$). One of these processing methods involves varying the initial silicon concentration, which requires matching copper concentrations in order to achieve compensation, and with the higher copper concentration corresponding to higher $Cu_B$ concentrations and thus, an enhanced $\sigma_{ss}$. The other processing method involves the preferential formation of $Cu_B$, which means that the majority of the diffused copper forms $Cu_B$ instead of $Cu_A$.

Figure 2:
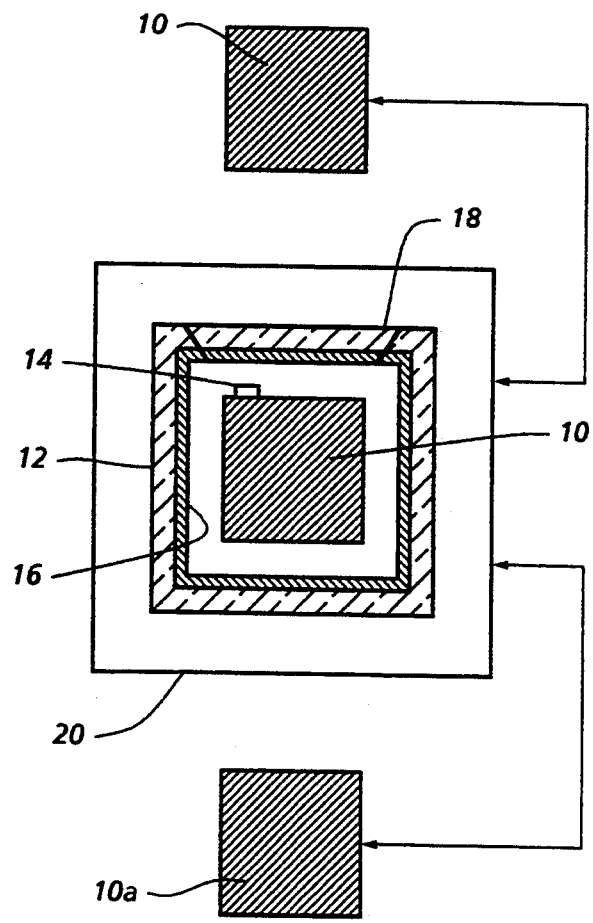
FIG. 2 is a schematic flow chart of one fabrication process of copper compensating silicon doped, gallium arsenide according to the present invention.

Referring now more particularly to FIG. 2, a gallium arsenide crystal 10 is received from a manufacturer with a known silicon concentration formed therein. The silicon concentration is important because it determines the amount of copper required to observe electrical compensation. Standard available concentrations of silicon in gallium arsenide crystals employed in the present invention include $1 \times 10^{16}$ cm$^{-3}$, $2 \times 10^{16}$ cm$^{-3}$, $6 \times 10^{16}$ cm$^{-3}$ and $7 \times 10^{17}$ cm$^{-3}$. The band diagram of FIG. 1 described hereinabove illustrates the locations of the silicon and copper levels.

At room temperature, the donor electrons associated with silicon are thermally ionized into the conduction band. Therefore, the material crystal 10 purchased from the manufacturer (GaAs:Si) is low resistively ($<0.1$ ($\Omega$ cm)). The copper is thermally diffused into the GaAs:Si in order to establish the known deep copper acceptors (Cu$_A$ and Cu$_B$) which trap the free electrons at energy levels that are not thermally ionized to any large degree at room temperature, to render the crystal highly resistive ($>10^5$ ($\Omega$ cm)$^{-1}$.

The GaAs:Si crystal 10 is loaded into a quartz ampoule 12, along with a solid source of arsenic 14 and a solid source of copper. In the illustrated embodiment of FIG. 2, quartz ampoule 12 is provided with an internal coating, or lining, of copper as designated by reference numeral 16. After positioning of the 0.05 cm thick GaAs:Si wafer 10 in quartz ampoule 12, the ampoule is evacuated to low pressure ($<5 \times 10^{-6}$ Torr), and sealed by cover 18. Ampoule 12 is then placed in a three zone furnace oven 20 wherein the temperature around and across the ampoule 12 is gradually increased over a six hour period to the desired temperature, while being controlled to $\pm 1°$ C. In a specific example, ampoule 12 is loaded with approximately ten (10) mg of solid arsenic and approximately three (3) mg copper.

After the GaAs:Si crystal 10 has reached the desired annealing temperature, the ampoule 12 is removed from oven 20, cooled to room temperature, and cover 18 removed to permit recover of an electrically compensated GaAs:Si:CU crystal 10a that may serve as the base material for a bistable, photoconductive switch. The GaAs:Si:Cu annealed wafer 10a is polished and gold germanium (Au:Ge) contacts are applied to the n-type wafers and gold-zinc (Au:Zn) contacts are applied to the p-type wafers. These contact metallizations are achieved by annealing at 440° C. for five minutes.

Figure 3:
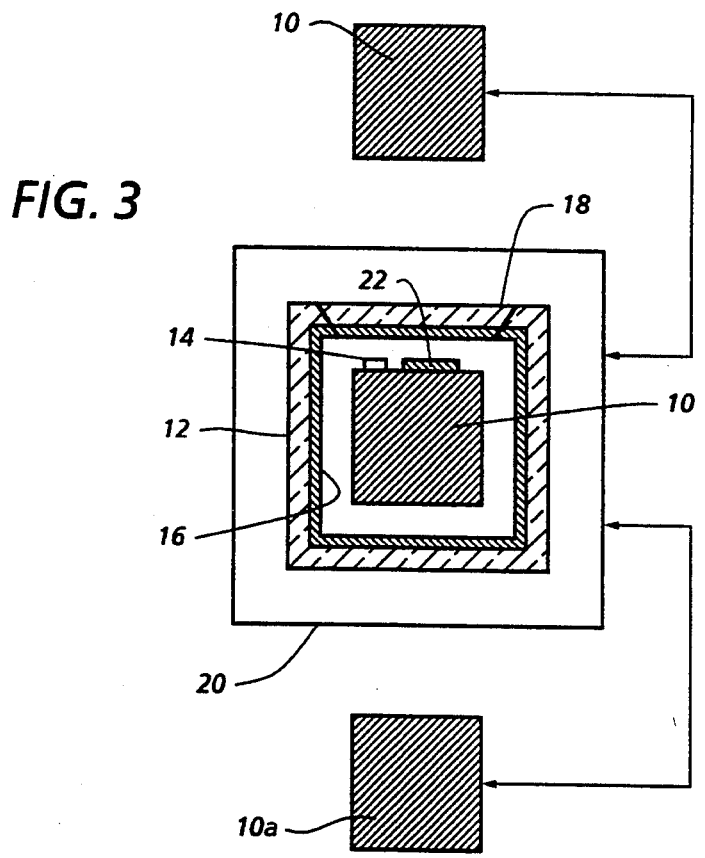
FIG. 3 is a flow chart similar to FIG. 2 and illustrating an alternate source of copper for the copper compensating fabrication process of the present invention.

Referring now to FIG. 3, an identical procedure is employed for achieving the compensation of a GaAs:Si crystal 10 except that the copper lining of quartz ampoule 12 is omitted. In this embodiment, an alternate copper source, in the form of a copper foil 22, is positioned directly on the GaAs:Si crystal 10 along with the solid arsenic 14.

Figure 4:
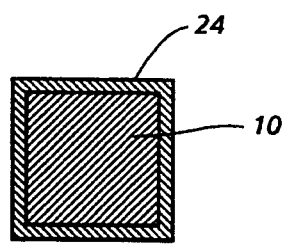
FIG. 4 is a view of a GaAs: Si sample plated with copper that may be employed in the process illustrated in FIG. 3.

Referring to FIG. 4, another source of the copper employed in the process described in reference to FIGS. 2 and 3 is in the form of a coating of copper 24 applied to the GaAs: Si crystal before placing it in furnace oven 20. The thickness of coating 24 would be designed to be only that which would be completely diffused into crystal 10 during the annealing process.

Figure 5:
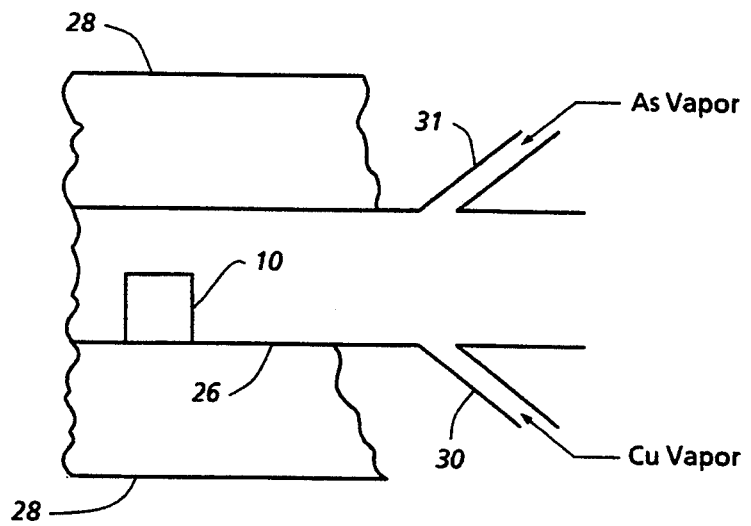
FIG. 5 is a schematic, partial view of a reaction tube disposed in a diffusion furnace and employed to copper compensate silicon doped, gallium arsenide crystals, according to one aspect of the present invention.
Figure 6:
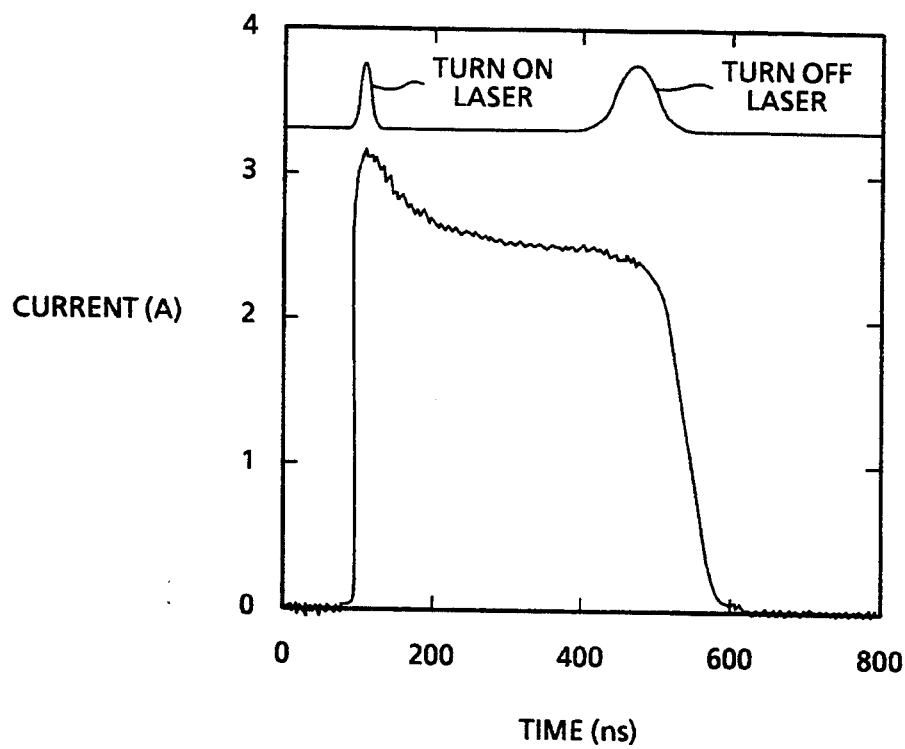
FIG. 6 is a graphical illustration of the changes in current of a GaAs:Si:Cu switch element of the present invention upon excitation by a turn-on and a turn-off laser pulse.

Referring now to FIG. 5, in lieu of the ampoule diffusion process described hereinabove in reference to FIGS. 2-4, the GaAs:Si crystal 10 is placed in a reaction tube 26 which is located in a diffusion furnace 28. The copper and arsenic partial pressure around crystal 10 in this procedure is controlled by flowing copper and arsenic vapor into reaction tube 26 via suitable glass tubing, designated by respective reference numerals 30, 31. The solid copper and solid arsenic are separately heated, in a conventional manner, and the vapor flow therefrom is controlled through suitable valves (not shown) leading to glass tubes 30,31.

Figure 7:
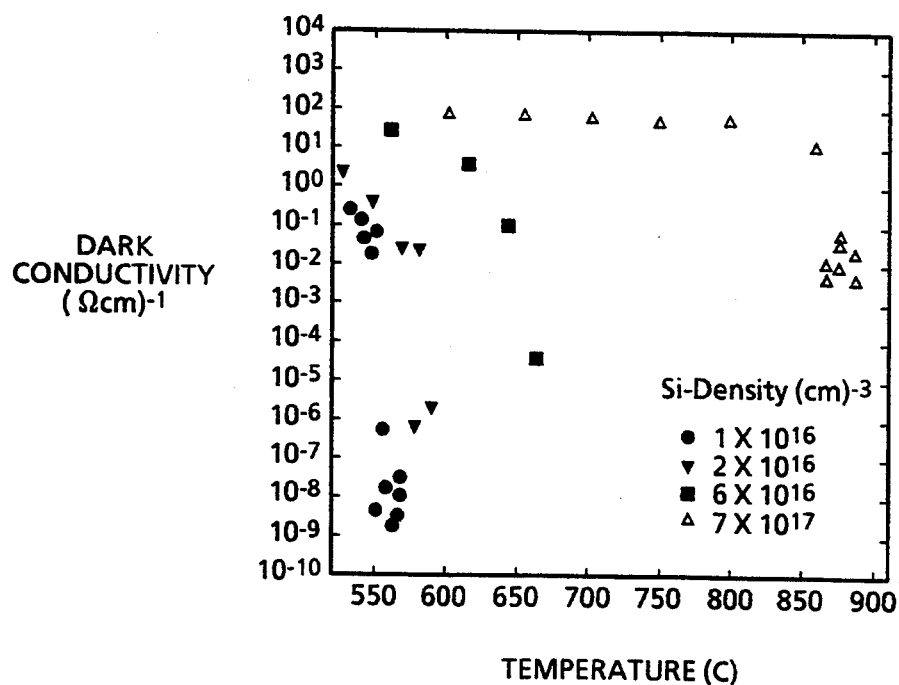
FIG. 7 is a plot of the temperature at which the lowest dark conductivity was achieved by the process of the present invention against different initial silicon concentration samples.

The temperature at which compensation is achieved for a specific silicon concentration can be predicted by plotting the temperature at which the lowest dark conductivity was achieved against the initial silicon concentration, in control samples, as illustrated in FIG. 7. As shown therein, the compensation for each silicon concentration occurred when a sharp drop in the dark conductivity was attained. Thus, for a gallium arsenide silicon concentration of silicon of $1 \times 10^{16}$ cm$^{-3}$, copper compensation would be expected to be obtained at approximately 550° C.; while a concentration of silicon of $2 \times 10^{16}$ cm$^{-3}$ in gallium arsenide would require a temperature of approximately 600° C.; a silicon concentration of $6 \times 10^{16}$ cm$^{-3}$ in gallium arsenide would require a temperature of approximately 650° C.; and a silicon concentration of $7 \times 10^{17}$ cm$^{-3}$ would be compensated at a temperature of approximately 875° C.

The condensation temperature may be defined as the temperature at which the GaAs:Si:Cu material wafer changes from the n-type to p-type, and as indicated in FIG. 7, the conductivity changes abruptly. As noted, the conductivity of the sample where $N_{Si} = 1 \times 10^{16}$ cm$^{-3}$ dropped by over seven orders of magnitude due to a change in temperature of only 2° C. At this temperature, the copper concentration is considered to be approximately equal to the silicon concentration such that the shallow silicon donors are compensated by the copper acceptors. The temperature corresponding to the lowest measured conductivity for exemplary specimens attained by the present invention are plotted against, and shown to agree with, copper solubility measurements made by others in FIG. 8. These values confirm that the compensation temperature can be predicted for a given silicon doping density, assuming that copper is singly ionized in GaAs:Si:Cu.

Figure 8:
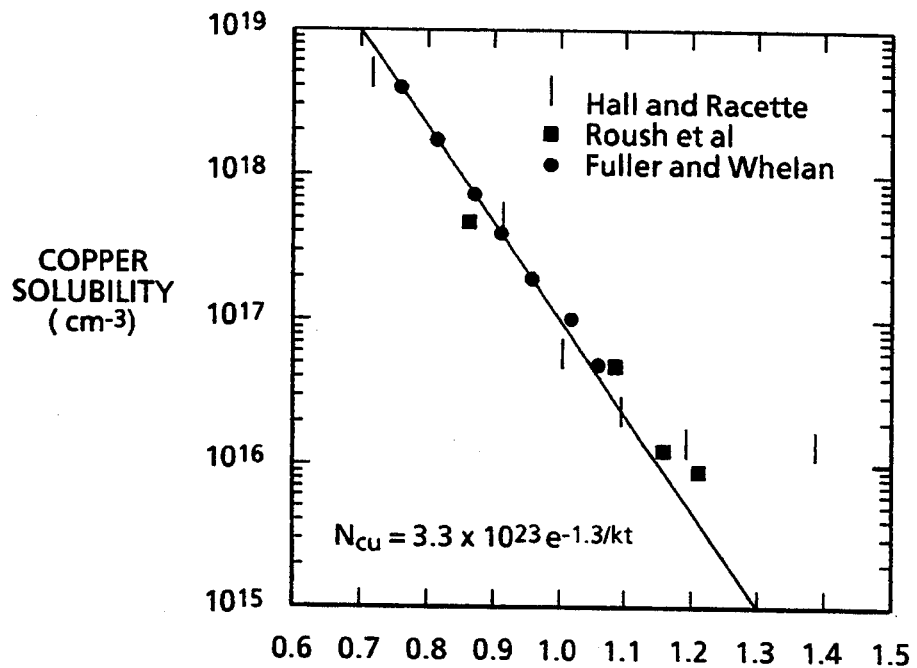
FIG. 8 is a plot of the solubility of copper with the compensation temperature for different silicon concentrations of the present invention as compared with results achieved by other processes.

As illustrated in FIG. 8, the compensation temperature depends exponentially on the initial silicon density and the results of the present invention correspond favorably with results obtained in prior art processes. Since the copper concentration must be approximately equal to, or slightly greater than, the silicon deity in order for electrical compensator to be observed, then the density of Cu$_B$ is enhanced by using higher silicon densities and higher annealing temperatures. This means for higher silicon densities, $\sigma_{ss}$ will be enhanced due to the higher Cu$_B$ concentration. Thus, and as apparent from FIG. 7, higher silicon densities lead to drastic improvements in $\sigma_{ss}$.

Another aspect of the present invention involves the preferential formation of Cu$_B$ as opposed to Cu$_A$. For a given silicon density, the diffused copper can form either Cu$_B$ or Cu$_A$, depending on the lattice effect throughout the GaAs crystal. A typical lattice defect in GaAs is an arsenic vacancy which has been proposed to be associated with Cu$_B$. In order to cause a change in the arsenic vacancy distribution in the GaAs crystal, the arsenic mass added to the ampoule 12 before the anneal can be altered.

Once the compensation temperature is found for each wafer, the dependency of the conductivity on the arsenic partial pressure in the specimen ampoule may be determined. First, the wafer with a silicon density ($N_{Si}$) of $1 \times 10^{16}$ cm$^{-3}$ was studied with arsenic masses of 0, 2, 11 and 93 mg added to ampoule 12. Care must be exercised when converting the arsenic mass in the ampoule to a partial pressure because of the tendency of copper and arsenic to form compounds (Cu$_5$As$_2$ and/or Cu$_3$As) during the anneal. Thus, if the copper mass of approximately 3 mg is similar to or much larger than the arsenic mass, a detailed knowledge of the reaction between arsenic and copper is needed to calculate the arsenic partial pressure in the ampoule for a given temperature. It is constructive to calculate the arsenic partial pressures without accounting for the possible reaction between copper and arsenic, using the ideal gas law and assumption that arsenic sublimates into As$_4$. Thus, for a temperature of 550° C., the arsenic partial pressures are 13, 106, 796 Torr, corresponding to arsenic masses of 2, 11, and 93 mg respectively.

Experiments showed that the lowest conductivity was obtained using the highest arsenic mass in the ampoule for $N_{Si}=1\times10^{16}$ cm$^{-3}$. The conductivity of a sample was 0.4 ($\Omega$ cm)$^{-1}$ without any arsenic, $2\times10^{-3}$ ($\Omega$ cm)$^{-1}$ with 2 mg arsenic, and $2\times10^{-6}$ ($\Omega$ cm)$^{-1}$ with 93 mg arsenic added to the ampoule. For higher values of $N_{Si}$, the arsenic mass in the ampoule had no effect on the conductivity.

With increasing copper concentrations, the low conductivity regions rise to values which are predicted, using only copper acceptors and silicon donors. Also, a ratio of $Cu_A$ to $Cu_B$ densities that is much larger than one (1) can cause the low conductivity region of the curve to occur over a smaller temperature range.

Figure 9:
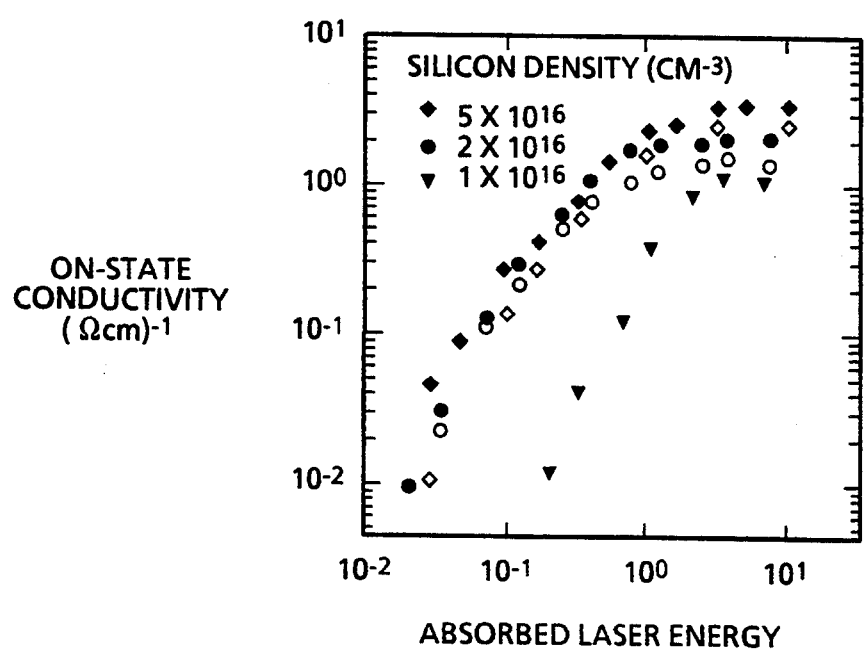
FIG. 9 is a plot of the "on-state" conductivity measurements in GaAs:Si:Cu wafers prepared according to the present invention and for different silicon concentrations.

The addition of large amounts of arsenic will cause few arsenic vacancies to be formed (and possibly create arsenic complexes) and therefore reduce the concentration of $Cu_B$ which causes $\sigma_{ss}$ to be reduced. FIG. 9 shows that the arsenic pressure in the ampoule does affect the saturation of the on-state conductivity, and lower arsenic pressures seem to give the best results. The amount of copper is chosen such that the partial pressure of copper in the ampoule provides a number density of copper atoms that is large compared to that required to be diffused into the GaAs.

In summary, the present invention involves improving the on-state conductivity of a GaAs:Si:Cu crystal by either (1) increasing silicon and copper concentration, or (2) by varying the arsenic pressure in the ampoule while heating the crystal to annealing temperature. It is noted that increased silicon concentrations lead to higher annealing temperatures to establish compensation, and the saturation of the on-state conductivity was improved dramatically using higher silicon concentrations. Also, the best $\sigma_{ss}$ was achieved using the lowest arsenic pressure in the ampoule (0 Torr).

The adjustment of the arsenic pressures allows the on-state conductivity of the material to be changed within a small range. This represents another parameter in the system which may be adjusted in order to customize the photoconductor to match the circuit or implementation requirements.

Therefore, it is readily seen that the present invention involves a process of fabricating electrically compensated gallium arsenide doped with a shallow donor to greater than $1\times10^{16}$ cm$^{-3}$, by the thermal diffusion of copper ($\approx 3$ mg) under an arsenic partial pressure (0-2500 Torr) and at temperatures exceeding 550° C. at which the diffused copper density equals the silicon density that may be predicted by the equation in FIG. 8.

The parameters of temperature, arsenic pressure, copper pressure, silicon density are all key factors, according to the present invention, in developing an optically activated switch that can operate with minimum resistance after the switch is turned on, while maintaining the desired high resistance when the switch is turned off. Although the specific examples described herein employ silicon as the shallow donor and copper as the deep acceptor, the invention is not so limited. The silicon density, as described herein, represents a density of free electrons in the material, since they are ionized at room temperature, and it is to be understood that any dopant which acts as a shallow donor may be used in place of silicon, within the scope of the present invention. Similarly, any deep acceptor, such as chrome and iron, which have energy levels that are between the copper level and the conduction band, are also applicable in practice of the present invention.

Although the specific example processes described herein are directed to gallium arsenide, the invention is not so limited and other materials which may be explored, by employing the process of the present invention, and with respect to photoconductive switching materials include, indium phosphide, zinc selenide, cadmium sulfide, gallium arsenic phosphide, and aluminum gallium arsenide. Each of these materials would represent a new start in the development of semiconductor processing techniques that could render effective switching components.

Numerous other variations and modifications of the present invention may be readily apparent to those skilled in the art in the light of the above teachings. It is therefore to be understood that any semiconductor compensating process that maintains the essential parameters of arsenic vapor pressure, temperatures, times, and silicon density, as described herein are considered within the scope of the present invention.

It is therefore to be understood that, within the scope of the appended claims, the invention may be practiced other than as specifically described herein.

What is claimed as new and desired to be secured by Letters Patent of the United States is:

1. A method of making a copper compensated, silicon doped, gallium arsenide crystal for use as a photoconductive switching component, comprising:
   (a) providing a gallium arsenide wafer having a known quantity of a shallow silicon donor formed therein;
   (b) incrementally heating the silicon doped gallium arsenide wafer in the presence of copper over an extended period of time to an annealing temperature of at least 550° C.; and
   (c) cooling the heated silicon doped, gallium arsenide wafer to recover a copper compensated, silicon doped, gallium arsenide wafer having the electrical property characteristic capability of being used as a photoconductive switching component.

2. The method of claim 1 wherein the step of incrementally heating the silicon doped gallium arsenide wafer in the presence of copper includes the steps of:
   positioning the silicon doped wafer in a quartz ampoule disposed in a three zone furnace oven;
   providing a quantity of copper in the quartz ampoule;
   evacuating the quartz ampoule to a low pressure of $<5\times10^{-6}$ Torr; and,
   sealing the quartz ampoule prior to incrementally heating the oven furnace to the annealing temperature of at least 550° C.

3. The method of claim 2 including the step of adding a solid mass of arsenic within the ampoule prior to sealing and heating thereof.

4. The method of claim 3 wherein the quantity of copper is obtained by providing a coating of copper on the inside surface of the quartz ampoule.

5. The method of claim 3 wherein the quantity of copper is provided by positioning a quantity of copper foil on a surface of the silicon doped gallium arsenide wafer.

6. The method of claim 3 wherein the quantity of copper is provided by a vapor coating of copper being provided on the surface of the silicon doped gallium arsenide wafer.

7. The method of claim 3 wherein the solid mass of arsenic is selected from quantities of arsenic consisting of 2, 14 and 93 mg solid arsenic masses.

8. The method of claim 7 wherein the presence of copper during heating of the silicon doped gallium arsenide wafer consists of a mass of 3 mg of copper.

9. The method of claim 1 wherein the step of incrementally heating the silicon doped gallium arsenide wafer includes the steps of:

positioning the silicon doped gallium arsenide wafer in a reaction tube loaded in a diffusion furnace; and, flowing copper vapor into the reaction tube while the diffusion furnace is incrementally heated to at least 550° C. to provide the presence of copper.

10. The method of claim 9 including the step of flowing arsenic vapor into the reaction tube while the diffusion furnace is incrementally heated to at least 550° C. to provide a presence of arsenic within the diffusion furnace.

11. The method of claim 1 wherein the silicon doped gallium arsenide wafer is provided with a silicon density selected from the group of silicon densities consisting of $1 \times 10^{16}$ cm$^{-3}$; $2 \times 10^{16}$ cm$^{-3}$; $6 \times 10^{16}$ cm$^{-3}$; and $7 \times 10^{17}$ cm$^{-3}$, and the incremental heating step includes heating the furnace to a temperature in the range of 550° C. to 875° C.

12. A thermal diffusion method of copper compensating silicon doped gallium arsenide wafers to facilitate the use thereof as switching components in photoconductive switches, comprising the steps of:

providing a silicon doped gallium arsenide wafer having a silicon density selected from the group of silicon densities consisting of $1 \times 10^{16}$ cm$^{-3}$; $2 \times 10^{16}$ cm$^{-3}$; $6 \times 10^{16}$ cm$^{-3}$; and $7 \times 10^{17}$ cm$^{-3}$; and, incrementally heating the silicon doped gallium arsenide wafer in the presence of copper over a six hour period and in the temperature range of 550° C. to 875° C. to thermally diffuse the copper into the wafer.

13. The method of claim 12 wherein the step of incrementally heating the silicon doped gallium arsenide wafer in the presence of copper also includes the step of providing a presence of arsenic.

14. The method of claim 13 wherein the step of incrementally heating the silicon doped gallium arsenide wafer is employed after the wafer is positioned with in a quartz ampoule and wherein the presence of copper and the presence of arsenic is attained by providing separate masses of arsenic and copper within the quartz ampoule.

15. The method of claim 14 wherein the separate mass of arsenic is selected from solid arsenic mass quantities consisting of 2, 14 and 93 mg solid arsenic masses.

16. The method of claim 14 wherein the separate mass of copper consists of a 3 mg mass of copper.

17. The method of claim 12 wherein the gallium doped gallium arsenide wafer is placed in a quartz ampoule disposed within a furnace oven to perform the step of incrementally heating thereof and the presence of copper is attained by providing a copper lining within the quartz ampoule.

18. The method of claim 12 wherein the silicon doped gallium arsenide wafer is placed in a quartz ampoule disposed within a furnace oven to perform the step of incrementally heating thereof and the presence of copper is attained by providing a copper coating on the silicon doped gallium arsenide wafer.

19. The method of claim 12 wherein the silicon doped gallium arsenide wafer is placed in a reaction tube disposed in a diffusion furnace and the presence of copper is attained by flowing a copper vapor over the wafer during the incremental heating thereof.

20. The method of claim 19 including the step of also flowing arsenic vapor over the silicon doped gallium arsenide wafer during the incremental heating thereof.

* * * * *